(12) United States Patent
Feldstein

(10) Patent No.: US 6,309,583 B1
(45) Date of Patent: Oct. 30, 2001

(54) COMPOSITE COATINGS FOR THERMAL PROPERTIES

(75) Inventor: Michael David Feldstein, Belle Mead, NJ (US)

(73) Assignee: Surface Technology, Inc., Trenton, NJ (US)

( * ) Notice: Subject to any disclaimer, the term of this patent is extended or adjusted under 35 U.S.C. 154(b) by 0 days.

(21) Appl. No.: 09/365,501

(22) Filed: Aug. 2, 1999

(51) Int. Cl.⁷ ........................................ C23C 24/00
(52) U.S. Cl. ............... 264/460; 264/114; 264/125; 264/127; 427/180; 427/304; 427/305; 427/437
(58) Field of Search ........................... 264/114, 125, 264/127, 460; 427/180, 304, 305, 437

(56) References Cited

U.S. PATENT DOCUMENTS

| | | | |
|---|---|---|---|
| Re. 29,285 | * | 6/1977 | Christini et al. . |
| Re. 33,767 | * | 12/1991 | Christini et al. . |
| 3,562,000 | * | 2/1971 | Parker . |
| 3,644,183 | * | 2/1972 | Odekerken . |
| 3,723,078 | * | 3/1973 | Parker . |
| 3,753,667 | * | 8/1973 | Metzger et al. . |
| 3,853,094 | * | 12/1974 | Christini et al. . |
| 3,912,500 | * | 10/1975 | Vereschagin et al. . |
| 3,936,577 | * | 2/1976 | Christini et al. . |
| 3,940,512 | * | 2/1976 | Christini et al. . |
| 4,305,792 | * | 12/1981 | Kedward et al. ........... 427/180 X |
| 4,666,786 | * | 5/1987 | Yano et al. . |
| 4,830,889 | * | 5/1989 | Henry et al. . |
| 4,997,686 | * | 3/1991 | Feldstein et al. . |
| 5,008,737 | * | 4/1991 | Burnham et al. . |
| 5,103,637 | * | 4/1992 | Itoh et al. . |
| 5,120,495 | * | 6/1992 | Supan et al. . |
| 5,130,771 | * | 7/1992 | Burnham et al. . |
| 5,145,517 | * | 9/1992 | Feldstein et al. . |
| 5,300,330 | * | 4/1994 | Feldstein et al. . |
| 5,783,316 | * | 7/1998 | Colella et al. . |
| 5,791,045 | * | 8/1998 | Yamamoto et al. . |
| 5,807,432 | * | 9/1998 | Hirabayashi . |
| 5,824,367 | * | 10/1998 | Park et al. . |
| 5,863,616 | * | 1/1999 | Feldstein et al. . |

* cited by examiner

Primary Examiner—Leo B. Tentoni

(57) ABSTRACT

This invention relates to processes for the formation of composite layers containing insoluble particles in metal matrices onto bodies to achieve enhanced thermal properties.

22 Claims, 1 Drawing Sheet

COMPOSITE COATINGS FOR THERMAL PROPERTIES

BACKGROUND OF THE INVENTION

This invention relates to processes for the formation of composite layers containing insoluble particles in metal matrices onto bodies to achieve enhanced thermal properties.

Countless applications in a wide array of industries require enhanced thermal properties including conduction and insulation. Deliberate material selection for these properties has been practiced throughout human history. When the use of a single material is not practical to achieve certain desired thermal properties, the use of coatings or composites is a widely accepted alternative. There are a vast number of coating methods to achieve enhanced thermal properties. This invention relates to processes for the formation of composite layers containing insoluble particles in metal matrices onto bodies to achieve enhanced thermal properties.

SUMMARY OF THE INVENTION

Composite plating is a technology well documented and widely practiced in both electrolytic and electroless plating. The development and acceptance of composite plating stems from the discovery that the inclusion of particles within a plated layer can enhance various properties of the plated layer, and in many situations actually provide entirely new properties to the plated layer. Particles of various materials can provide characteristics including thermal properties, wear resistance, lubricity, corrosion resistance, phosphorescence, friction, light absorption, altered appearance, and others. See FIG. 1 which shows a typical cross sectional view of a composite layer of particles (1) in a metal matrix (2) on a body (3).

Although composite electrolytic plating predates composite electroless plating, composite electroless plating has been developed into a well established field. A well documented survey of composite electroless plating can be found in "Electroless Plating Fundamentals and Applications" edited by G. Mallory and J. B. Hadju, Chapter 11, published by the American Electroplaters Society, 1990.

Early development of composite electroless plating includes the work of Odekeren in U.S. Pat. No. 3,644,183 which was directed toward increasing the corrosion resistance by the incorporation of certain particulate material. Metzger et al documented a wider variety of plated alloys and particulate materials capable of being composite plated in U.S. Pat. No. 3,753,667. In U.S. Pat. Nos. 3,562,000 and 3,723,078, Parker further demonstrated an assortment of materials including metallic particles which can be codeposited from an electroless plating bath.

In U.S. Pat. No. 3,853,094, Christini et al disclosed an electroless plating apparatus which serves to insure the uniformity of particulate dispersion within a composite electroless plated layer. Subsequent work by Christini et al in U.S. Pat. Nos. 3,936,577 and 3,940,512, and Reissue Pat. Nos. 29,285 and 33,767 concentrated on the codeposition of diamond particles within electroless plating.

Additional inventions in the field of composite electroless plating include the use of a wider array of particulate materials such as Yano et al in U.S. Pat. No. 4,666,786 and Henry et al in U.S. Pat. No. 4,830,889.

Spencer et al illustrated the benefit of including a blend of distinct particle sizes within the composite plated layer. Feldstein et al disclosed plating bath stability benefits resulting from the addition of particulate matter stabilizers to the plating bath in U.S. Pat. Nos. 4,997,686, 5,145,517, 5,300,330, and 5,863,616.

Material selection for thermal properties has been widely practiced throughout history. Certain ceramic materials, plastics, and textiles are widely utilized for their thermal insulating abilities. Common examples of such applications include Styrofoam cups and fiberglass insulation. A number of methods have been developed to apply heat insulating materials to various articles including the employment of composite electrolytic plating. One such example can be found in U.S. Pat. No. 5,103,637 by Itoh et al where heat insulating particles such as zirconia, yttria, ceria, silica, alumina, titania, and mullite are codeposited within an electrolytic plated metal matrix.

Materials such as copper, silver, aluminum, and diamond are well known for their excellent thermal conductivity properties. Examples include copper bottoms of cookware, radiator cores, and copper heat sinks used in electronic applications. Heat transfer in electronic applications is a field which has generated much commercial interest and research and development. Heat sinks are a primary area of interest for these properties in this field.

To employ the properties of diamond for instance, a wide array of methods have been developed to produce an article comprised of or coated with diamond such as microwave chemical vapor deposition (CVD), thermal filament CVD, high frequency CVD, electron cyclotron resonance microwave CVD, direct current plasma CVD, ion plating physical vapor deposition (PVD), ion beam sputtering PVD, ion deposition PVD, ion beam deposition PVD, composite electrolytic plating, and others. Poor adhesion, brittleness, nonuniformity, substrate incompatibility, geometry constraints, thickness restrictions, and cost of these diamond, diamond containing, or diamond like films to substrates have traditionally been limited to these methods in many applications. Many procedures have been developed with varying degrees of success to overcome these limitations. In U.S. Pat. No. 5,824,367, Park et al. discusses the improved adhesion such diamond films onto substrates that have previously been electrolessly nickel plated.

Industries concerned with heat transfer have pursued the use of diamond for improved heat transfer. Heat sinks which exist in a variety of sizes and types for electronic and other applications are a prime example. See FIG. 2 of a typical heat sink. Specific examples include U.S. Pat. No. 5,791,045 wherein Yamamoto disclosed a method for manufacturing diamond heat sinks by inserting diamond or polycrystalline cubic boron nitride into gaps in a base material, growing diamond on the surface of this unit, and then removing the base material. Hirabayashi taught another method of producing a diamond covered member for heat sinks and other applications in U.S. Pat. No. 5,807,432.

Because the use of certain theoretically ideal materials is often not possible for a number of reasons including physical limitations and economic factors; efforts have been made in the past to produce composites of two or more materials that are physically possible, practical, economic, and effective for the desired thermal characteristics. In U.S. Pat. No. 5,783,316, Colella et al. describe a composite of diamond particles compacted into a porous body and infiltrating the porous body with a brazeable material such as copper-silver. Other prior art involved with hot pressing diamond-metal compacts include Vereschagin's U.S. Pat. No. 3,912,500, Burnham's U.S. Pat. Nos. 5,008,737 and 5,130,771, and Supan's U.S. Pat. No. 5,120,495.

Despite these efforts, the utilization of certain materials with desirable heat transfer properties is still not possible or practical in many applications. This invention relates to processes for the formation of composite layers containing insoluble particles in metal matrices onto bodies to achieve enhanced thermal properties.

DETAILED DESCRIPTION OF THE INVENTION

More specifically this invention relates to the codeposition of particles of materials with desirable heat transfer properties within an electroless metal or alloy plated matrix. This invention extends the properties of the particulate matter to the article in a method compatible with a very wide array of substrates of nearly any geometry, and at a practical cost compared to many more involved deposition processes.

Further included in this invention is the process of coating a body possessing a specific geometry by the processes disclosed herein and subsequently removing the substrate from the coated layer by mechanical or chemical means to leave a composite structure with properties useful in heat transfer applications.

Since a composite with a high density of particles may be useful, another method included in this invention is as follows:

Particles can be plated, or otherwise encapsulated, in a wide variety of materials including metals, alloys, plastics, ceramics, etc. Encapsulated particles can then be applied to a substrate via a number of processes including, but not limited to, electrical charge, magnetism, centrifugal force, and gravity. The encapsulating material's composition could then be modified to create a composite of the particles and encapsulating material where the encapsulating material becomes the matrix material. For example, for a layer with enhanced heat transfer properties, the following procedure could be used:

1) Plate diamond or other particles with a very thin film of a suitable metal or alloy such as copper, silver, gold, nickel or other.
2) Apply the plated particles onto a substrate.
3) Heat the substrate and plated particles to a temperature sufficient to melt slightly the metal on the particles so it will "fuse" together to be a composite of a high density of particles within a metal matrix.

This invention includes particles of all types, encapsulating materials of all types, all methods of encapsulating, all methods of applying the encapsulated particles onto a substrate, and any possible methods of converting the encapsulating material into a matrix. The above is just one example.

DETAILED DESCRIPTION OF THE DRAWINGS

EXPERIMENTAL

Figure 1:
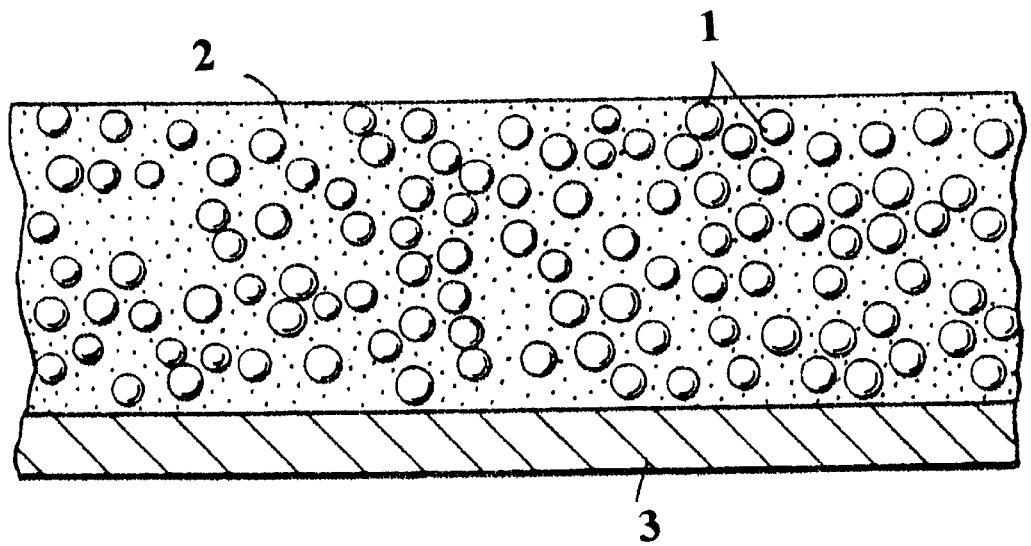
FIG. 1 is an enlarged cross sectional view of a typical composite layer of particles in a metal matrix on a body.
Figure 2:
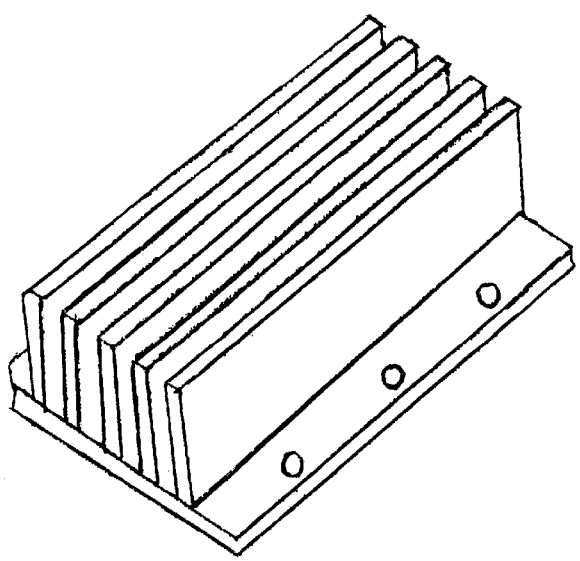
FIG. 2 is a typical heat sink.

Aluminum tubes (Alloy 6061) with an outside diameter of 2.0" and a wall thickness of 0.065" and lengths of 8.0" were treated as indicated below, with one tube (No. 1) left untreated for a control.
Tube Number
1. control (no surface treatments)
2. 25 micron thick layer of composite electroless nickel with 4 micron diamond plated on outside wall by the plating bath commercially known as NiPLATE®800 of Surface Technology, Inc., Trenton, N.J.
3. 25 micron thick layer of electroless nickel plated on outside wall by the plating bath commercially known as NiPLATE® 130 of Surface Technology, Inc., Trenton, N.J.
4. 25 micron thick layer of composite electroless nickel with 1200 grit silicon carbide plated on outside wall by the plating bath commercially known as NiPLATE® 700, of Surface Technology, Inc., Trenton, N.J.
5. sandblasted with silicon carbide at 100 psi to produce a rough surface Prior to testing, each tube was sealed with a cork on one end to form a water tight seal. The tubes were clamped to a ring stand with an insulated clamp and placed in a vertical position with the open end facing up. Thermometers were then suspended from other clamps so that their bulbs were in the centers of the tubes and 4.0" above the seals. Various hot liquids were subsequently poured simultaneously into the different tubes with suspended thermometers. The temperature of the hot liquids in each tube was recorded as a function of time. The rate of heat loss over time for the liquid in each tube provides a measurement of the respective tube's (and its surface treatment) heat transfer properties. All experiments were done in a room with an ambient temperature of 19.8° C.

EXAMPLE 1

300 ml of water heated to 83° C. was poured simultaneously into tubes No. 1 and 2.

The following results were obtained:

| TIME ELAPSED IN MINUTES | TEMP. OF TUBE No. 1 -- ° C. | TEMP. OF TUBE No. 2 -- ° C. |
| --- | --- | --- |
| 0 | 83.0 | 83.0 |
| 9 | 72.0 | 70.0 |
| 19 | 65.8 | 64.2 |
| 34 | 55.8 | 52.5 |
| 64 | 40.8 | 36.8 |

Repeat runs of this experiment gave similar results; tube No. 2 always reached a lower temperature than the control tube No. 1 during the duration of the run, demonstrating the improved heat dissipation properties achieved by the electroless nickel-composite diamond coating on tube No. 2.

EXAMPLE 2

In this experiment, all conditions used in Example 1 were identical except instead of filling the tubes with 300 ml of $H_2O$, 300 ml of commercial (ethylene glycol) antifreeze (Prestone) at 112° C. was used as the liquid.

The following results were obtained:

| TIME ELAPSED IN MINUTES | TEMP. OF TUBE No. 1 -- ° C. | TEMP. OF TUBE No. 2 -- ° C. |
| --- | --- | --- |
| 0 | 112.0 | 112.0 |
| 9 | 89.9 | 83.8 |
| 15 | 79.9 | 71.8 |
| 21 | 71.0 | 62.8 |
| 65 | 41.8 | 35.0 |

These results confirm the improved heat dissipation properties achieved by electroless nickel-composite diamond coating on tube No. 2 compared to the control tube No. 1 with a different liquid.

EXAMPLE 3

Tubes No. 2, 3, and 5 were tested in the same experimental apparatus as in Example 1, with water at 85° C.

The following results were obtained:

| TIME IN MINUTES | TEMP. OF TUBE NO. 2 -- ° C. | TEMP. OF TUBE NO. 3 -- ° C. | TEMP. OF TUBE NO. 5 -- ° C. |
| --- | --- | --- | --- |
| 0 | 85.0 | 85.0 | 85.0 |
| 5 | 78.5 | 79.5 | 80.2 |
| 15 | 65.0 | 68.0 | 67.0 |
| 25 | 56.2 | 60.2 | 59.0 |

Again, this experiment clearly shows that tube No. 2 with the electroless nickel-composite diamond coating was the most effective in dissipating heat. It further demonstrates that the presence of the diamond particles on tube No. 2 is effective in heat dissipation compared to tube No. 3 which is coated identically to tube No. 2 with the exception of the diamond particles.

EXAMPLE 4

Experimental conditions were the same as described in Example 1 with water at 86° C. in tubes 2, 4, and 5.

The following results were obtained:

| TIME ELASPED IN MINUTES | TEMP. OF TUBE NO. 2 -- ° C. | TEMP. OF TUBE NO. 4 -- ° C. | TEMP. OF TUBE NO. 5 -- ° C. |
| --- | --- | --- | --- |
| 0 | 86.0 | 86.0 | 86.0 |
| 5 | 67.0 | 69.5 | 70.0 |
| 27 | 51.8 | 54.0 | 55.0 |
| 42 | 43.8 | 46.5 | 47.2 |

This Example not only demonstrates again the effectiveness of the electroless nickel-composite diamond coating for heat dissipation, it also shows the improved results of tube No. 4 with an electroless nickel-composite silicon carbide coating.

EXAMPLE 5

Five different tubes were tested simultaneously with the identical conditions of Example 1 and water at 89° C.

| TIME IN MINUTES | TEMP. OF TUBE NO. 1 ° C. | TEMP. OF TUBE NO. 2 ° C. | TEMP. OF TUBE NO. 3 ° C. | TEMP. OF TUBE NO. 4 ° C. | TEMP. OF TUBE NO. 5 ° C. |
| --- | --- | --- | --- | --- | --- |
| 8:35 | 89.0 | 89.0 | 89.0 | 89.0 | 89.0 |
| 8:43 | 83.0 | 80.0 | 81.5 | 80.0 | 82.0 |
| 9:06 | 68.3 | 61.8 | 66.0 | 61.0 | 65.0 |
| 9:20 | 61.4 | 54.0 | 58.9 | 52.5 | 57.0 |
| 9:38 | 56.0 | 48.1 | 53.0 | 46.8 | 51.2 |
| 9:50 | 51.0 | 43.0 | 48.0 | 41.5 | 46.0 |

The results of this expanded side-by-side example show the superiority of both electroless nickel-composite coatings (Tubes No. 2 and 4) compared to the control Tube No. 1, blasted only Tube No. 5, and Tube No. 3 with electroless nickel without codeposited particles.

What I claim is:

1. The process of providing portions or all of a body with a layer, said process comprising the application of particles which are covered or substantially covered with an encapsulating material or materials to at least a portion of said body and then affecting a modification in the composition of said encapsulating material or materials to form an integrated composite layer of particles within said encapsulating material or materials.

2. The process as in claim 1 where said encapsulating material contains a metal, metals, or alloy.

3. The process as in claim 1 where said encapsulating material contains nickel.

4. The process as in claim 1 where said encapsulating material contains gold.

5. The process as in claim 1 where said encapsulating material contains silver.

6. The process as in claim 1 where said encapsulating material contains copper.

7. The process as in claim 1 where said particles are diamond.

8. The process as in claim 1 where said particles are silicon carbide.

9. The process as in claim 1 where said particles are ceramic.

10. The process as in claim 1 where said particles are PTFE.

11. The process as in claim 1 where said particles are metallic.

12. The process as in claim 1 where said body contains aluminum.

13. The process as in claim 1 where said body contains steel.

14. The process as in claim 1 where said body contains copper.

15. The process as in claim 1 where said body contains titanium.

16. The process as in claim 1 where said application of particles to the body is via magnetism.

17. The process as in claim 1 where said application of particles to the body is via gravity.

18. The process as in claim 1 where said application of particles to the body is via electrical charge.

19. The process as in claim 1 where said application of particles to the body is via centrifugal force.

20. The process as in claim 1 where said encapsulating material is modified by heat to form an integrated composite.

21. The process as in claim 1 where said encapsulating material is modified by pressure to form an integrated composite.

22. The process as in claim 1 where said body is subsequently removed from said layer.

* * * * *